(12) United States Patent
Füsser

(10) Patent No.: US 6,602,829 B1
(45) Date of Patent: Aug. 5, 2003

(54) METHOD FOR APPLYING A LUBRICATING LAYER ON AN OBJECT AND OBJECT WITH AN ADHESIVE LUBRICATING LAYER

(75) Inventor: Hans-Jürgen Füsser, Gerstetten (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/701,008

(22) PCT Filed: Apr. 24, 1999

(86) PCT No.: PCT/EP99/02791

§ 371 (c)(1),
(2), (4) Date: Feb. 8, 2001

(87) PCT Pub. No.: WO99/61682

PCT Pub. Date: Dec. 2, 1999

(30) Foreign Application Priority Data

May 22, 1998 (DE) .......................... 198 22 934

(51) Int. Cl.$^7$ ........................ C23C 16/04; C23C 28/04; C10M 125/26
(52) U.S. Cl. ................... 508/100; 508/155; 508/156; 428/457; 428/627; 428/681; 148/279; 148/330
(58) Field of Search .................. 508/100, 155, 508/156; 428/457, 627, 681; 148/330, 279

(56) References Cited

U.S. PATENT DOCUMENTS

| 4,147,639 A | * | 4/1979 | Lee et al. ................ 72/42 |
| 4,999,241 A | * | 3/1991 | Coduti et al. ............ 428/340 |
| 5,082,512 A | * | 1/1992 | Futamura et al. ........ 428/627 |
| 5,958,847 A | * | 9/1999 | Novak ................... 508/156 |

OTHER PUBLICATIONS

Bindal et al., "Ultralow friction behavior of borided steel surfaces after flash annealing", *Appl. Phys. Lett.* 68 (7), Feb. 12, 1996, pp. 923–925.

Erdemir et al., "Tribological Properties of Boric Acid and Boric–Acid–Forming Surfaces. Part II: Mechanisms of Formation and Self–Lubrication of Boric Acid Films on Boron–and Boric Oxide–Containing Surfaces©", *Journal of the Society of Tribologists and Lubrication Engineers*, presented at the 45$^{th}$ Annual Meeting, May 1990, pp. 179–184.

Erdemir et al., "Formation and self–lubricating mechanisms of boric acid on borided steel surfaces", *Surface and Coating Technology* 76–77 (1995), pp. 443–449.

* cited by examiner

Primary Examiner—Jacqueline V. Howard
(74) Attorney, Agent, or Firm—Crowell & Moring LLP

(57) ABSTRACT

The invention relates to a method for the application of a lubricant layer to a frictionally stressed surface of an object, and to a corresponding object, the lubricant layer, in use, containing boric acid. For production, the object is introduced into a reactor and the reactor is evacuated. Then, to produce an adhesion-promoter layer, a process gas is introduced, which contains boron, nitrogen and/or carbon at least in the form of a compound or releases the corresponding element under process conditions, and penetrates into the region of the surface of the object, in particular by diffusion. To produce an intermediate layer containing boron and oxygen, a second precursor material, which contains boron at least in the form of a compound and releases the boron under process conditions, and a first precursor material, which contains oxygen at least in the form of a compound and releases the oxygen under process conditions, are introduced into the depositing gas phase. At the latest in use, the boron and the oxygen of the intermediate layer are at least partially converted, at least in the region of their freely accessible surface, into boric acid as dry lubricant with the aid of hydrogen.

68 Claims, 2 Drawing Sheets

METHOD FOR APPLYING A LUBRICATING LAYER ON AN OBJECT AND OBJECT WITH AN ADHESIVE LUBRICATING LAYER

This application is a 371 of PCT/EP99/02791 filed Apr. 24, 1999.

BACKGROUND AND SUMMARY OF THE INVENTION

The invention relates to a method for the adhesive application of a lubricant layer to an exposed, frictionally stressed surface of an object, and to an object with a lubricant layer adhering to an exposed surface, as are both known, for example, from the article which forms the basis of the precharacterizing clause "Formation and self-lubricating mechanisms of boric acid on borided steel surfaces" by A. Erdemir et al. in Surface and Coating Technology 76–77, 1995, pp. 443–490.

The invention relates to a method for the adhesive application of a lubricant layer to an exposed, frictionally stressed surface of an object, and to an object with a lubricant layer adhering to an exposed surface, according to the preambles of claims 1 and 30, respectively, as are both known, for example, from the article which forms the basis of the precharacterizing clause "Formation and self-lubricating mechanisms of boric acid on borided steel surfaces" by A. Erdemir et al. in Surface & Coating Technology 76–77, 1995, pp. 443–490.

The article "Formation and self-lubricating mechanisms of boric acid on borided steel surfaces" by A. Erdemir et al. in Surface & Coating Technology 76–77, 1995, pp. 443–490 has disclosed a coating of a dry lubricant made from boric acid on steels and a method for applying the coating. In the method which is known from this document, a steel is firstly borided. The borided surface of the steel has a good hardness and resistance to corrosion. However, its coefficient of friction is very high. Therefore, the borided surface of the steel is provided with a lubricant layer of boric acid, which acts as a dry lubricant. For the boriding, the steel is immersed in a salt bath which contains a boron compound and is heated to 940° C. After the salt bath, the borided steel is heated to 750° C., allowing the boron atoms to diffuse more deeply into the surface region of the steel. It is assumed that some of the atoms also diffuse at the free surface, where they immediately react, in the presence of oxygen, to boron oxide. As a result, a boron oxide layer, which during the subsequent cooling and in the presence of hydrogen is converted into boric acid, is deposited on the surface of the steel. However, to form the boron oxide the temperature must not be reduced to less than 750° C., and the borided steel must also be heated to this temperature for no longer than 8 min, since otherwise no boron oxide is formed. Apart from the fact that this heat treatment represents an immense load on the steel, the process for producing the boron oxide layer is highly sensitive, and consequently the known method is very involved, complicated and expensive. Furthermore, it is difficult to produce near net shape, in particular accurately dimensioned components using this method, and a high reject rate is involved. Also, the entire method is highly inflexible, in particular for changing layer thicknesses.

The article "A study of the formation and self-lubrication mechanisms of boric acid films on boric oxide coatings" by A. Erdemir et al. in Surface & Coating Technology 43/44, 1990, pp. 588–596 has likewise disclosed a coating of a dry lubricant comprising boric acid and a method for applying this coating. In this method, the surfaces of an object made from alpha-alumina and an object made from steel (M50) were cleaned by an argon ion beam and were then coated with the boron oxide in vacuo by means of electron beam evaporation. In both cases, the coefficients of friction of the lubricant layers, which were a few $\mu$m thick, were very good, although the service life of the coating on steel was short. Furthermore, the adhesion of the lubricant layers made from boric acid to the substrates was low, and consequently this method also involves a high reject rate.

The object of the invention is to provide a method with which in particular a metallic object can be provided with a successfully adhering lubricant layer of a dry lubricant at low cost, within tight manufacturing tolerances and with low reject rates, the intention being that the dry lubricant should have the lowest possible coefficient of friction and the longest possible service life. A further object of the invention is to develop a successfully adhering lubricant layer of a dry lubricant for in particular a metallic object, which lubricant layer is applied at low cost, within tight manufacturing tolerances and with low reject rates, the dry lubricant having the lowest possible coefficient of friction and the longest possible service life. The layer structure according to the invention and the application of the individual layers, preferably by means of a plasma Chemical Vapor Deposition (CVD) process, allow the layer thicknesses to be applied reproducibly in the $\mu$m range in a simple manner, so that at least one complex remachining step can be dispensed with. Furthermore, the adhesion to the object is improved by the procedure according to the invention.

BRIEF DESCRIPTION OF THE DRAWINGS

The invention is explained in more detail with reference to examples and the following drawings, in which.

DETAILED DESCRIPTION OF THE INVENTION

Figure 1:
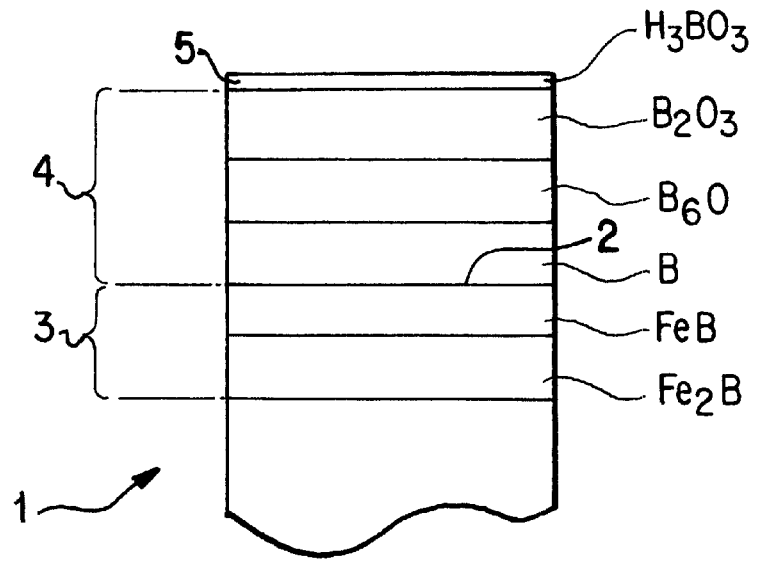
FIG. 1 shows a detail of a section through a layer structure according to the invention of a coated object.

FIG. 1 shows a detail of a section through a layer structure according to the invention of a coated object 1, on a very distorted scale. In the region of its surface 2 which faces outwards and is covered with the coating, the metallic object 1 made from steel has a borided adhesion-promoter layer 3 containing borides of the material from which the object 1 is made. In the present case, iron borides are arranged inside the adhesion-promoter layer 3. Starting from the inside, firstly mainly $Fe_2B$ is present, followed by mainly FeB.

Instead of pure boriding, to produce the adhesion-promoter layer 3, those regions of the object 1 which are close to the surface may also be nitrided and/or carbonized and/or carbonitrided. In addition, adhesion-promoter layers 3 of this nature may also be borided. As an alternative to an object 1 made from steel, it is also possible for an object made from another material, but preferably from a Ti and/or Al and/or Mg material, to be provided with the coating according to the invention.

On the previously exposed surface 2 of the object 1, the adhesion-promoter layer 3 is followed by an intermediate layer 4 which contains boron and its oxides. In particular, the intermediate layer 4—starting from the previously exposed surface 2 of the object 1—firstly contains at least predominantly boron, then at least predominantly $B_6O$, and finally $B_2O_3$. The lubricant layer 5 containing boric acid ($H_3BO_3$) is arranged on the $B_2O_3$, the proportion of boric acid in the lubricant layer 5, at least in the vicinity of the surface, being at least 5%, preferably 10%, and particularly preferably 30%.

The boric acid which is used as dry lubricant may be formed in particular firstly or else in addition, in particular in the event of wear to the previous lubricant layer 5 containing boric acid, in use by the $B_2O_3$ in the vicinity of the surface being converted in the presence of water or hydrogen. Therefore, it is advantageously possible for the intermediate layer 4 which contains boron and oxygen, in particular $B_2O_3$, to form a type of reservoir for the boric acid of the lubricant layer 5 in the event of wear.

Figure 2:
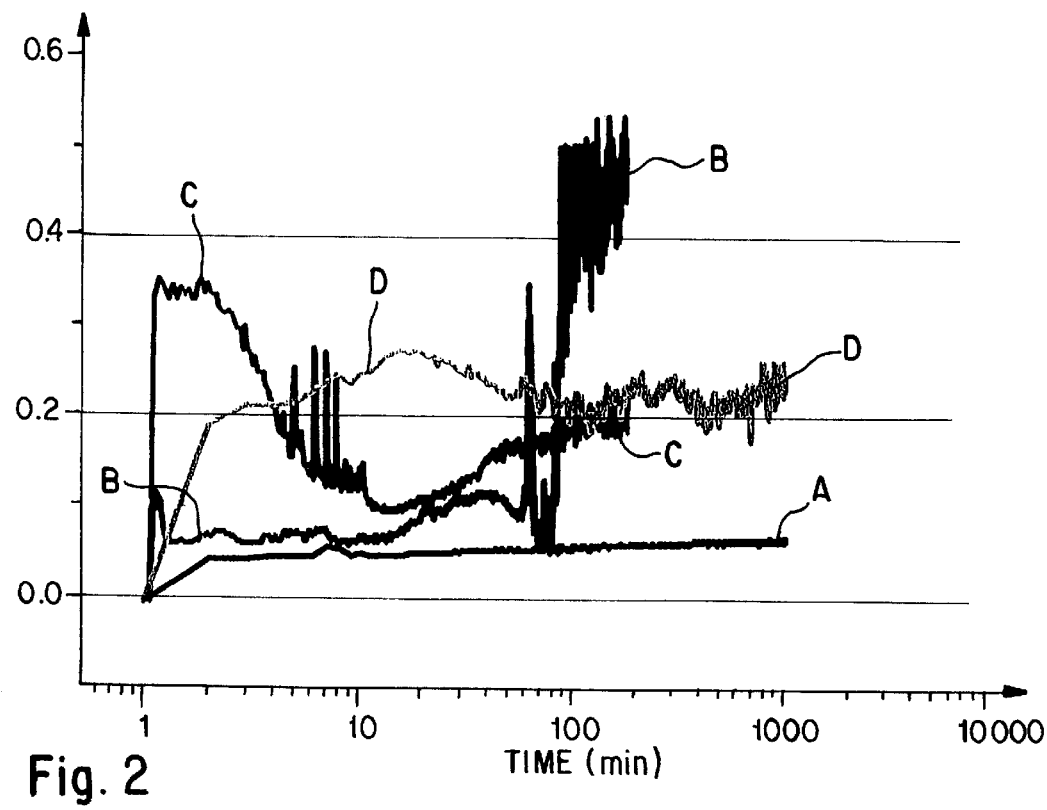
FIG. 2 shows a diagram illustrating the coefficient of friction as a function of time for objects coated with different dry lubricants under a fatigue wear test.

FIG. 2 shows a diagram illustrating the coefficient of friction as a function of time for objects which are coated with different dry lubricants and have been subjected to a fatigue wear test.

The individual curves relate to objects made from the following materials:

Curve A: an object 1 having a layer structure according to the invention with a lubricant layer of boric acid, Curve B: a molybdenumsulphide layer ($MOS_2$) on an object made from a sintered carbide, Curve C: amorphous diamond on an object made from a sintered carbide, and Curve D: a tungsten carbide/graphite layer on an object made from a superhigh-speed steel.

The tests were carried out in the dry state, i.e. without additional, in particular liquid, lubrication. The test bodies used were a ball of 100Cr6 with a radius of 4 mm which was pressed onto the substrate to be coated under a load of 5 N and was moved to and fro over a length of 600 $\mu$m at a frequency of 10 kHz.

The object 1 coated with the WC/C layer (curve D) presents a coefficient of friction which, after an initial running-in phase, is established at between 0.2 and 0.3. This value is maintained within the abovementioned range for just over 100 minutes and then rises. At approximately 4000 minutes it is approximately 0.45.

The object 1 coated with amorphous diamond (curve C) presents a coefficient of friction which, following an initial running-in phase which lasts for about 10 minutes and during which the coefficient of friction fluctuates between about 0.1 and 0.35, is established at approximately 0.1. Beyond this point, the coefficient of friction rises constantly as the time of loading increases. As can be seen from the diagram shown in FIG. 2, the coefficient of friction rises from approximately 0.1 after 10 minutes to approximately 0.2 within approximately 190 minutes.

The object 1 coated with $MOS_2$ (curve B) has a coefficient of friction which, after a very short running-in phase, is established at between approximately 0.05 and approximately 0.1. This level of coefficient of friction is maintained within the said range for approximately 100 minutes and then very quickly rises to over 0.4. This means that the material has a very good short-term performance but a very poor long-term performance.

After an initial running-in phase of approximately 1 minute, the object 1 which has the layer structure according to the invention (curve A) has a coefficient of friction which is established at approximately 0.05. This coefficient of friction is maintained unchanged throughout the entire time of the test. In particular, it should be mentioned here that the coefficient of friction still remained stable even after a test time which was longer than the time of 10,000 minutes shown in the diagram.

Figure 3:
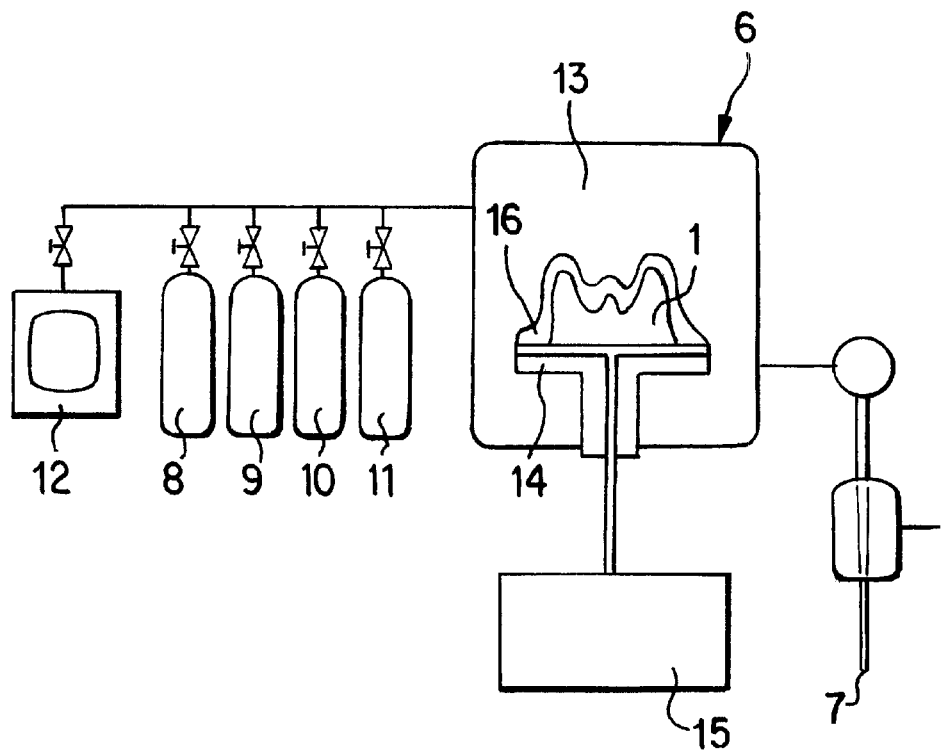
FIG. 3 shows a device for producing the coating according to the invention.

FIG. 3 shows a device in the form of a plasma Chemical Vapor Deposition (CVD) installation which is suitable for carrying out the method according to the invention which can be used to produce the layer structure according to the invention.

The device has a reactor 6 which can be evacuated by a pump system 7 which is in fluid communication therewith. Furthermore, the reactor 6 has a gas supply system with a plurality of gas cylinders 8–11 and an evaporator 12. The gas supply system, like the pump system 7, can be switched on and off. The gas cylinders 8–11 and the evaporator 12 can be connected to the interior 13 of the reactor 6 individually and with a controllable gas flow. The gas cylinders 8–11 are used to store, for example, the process gases, a gas which assists the plasma 16 and/or precursor materials for the layer structure according to the invention. In particular, they store the gases methane, diborane, hydrogen, oxygen and nitrogen.

Inside the reactor 6 there is a substrate holder 14 on which an object 1 to be coated can be arranged. To supply voltage, the substrate 14 is connected in an electrically conductive manner to a generator 15. The generator 15 which is provided for generating the plasma may, for example, be operated with AC electric voltage, with an AC voltage with capped half-cycle or the like, preferably with a pulsed DC voltage.

To produce a layer structure according to the invention, the object 1 to be coated is introduced into the reactor 6, and the reactor interior 13 is evacuated to a pressure of less than 100 mbar, preferably less than 10 mbar, and particularly preferably to approximately 1 mbar. Following the evacuation, the reduced pressure which has been reached is maintained in the reactor interior 13. If appropriate, the reactor interior 13 may also be at least partially filled again with an inert gas.

Then, a desired pulsed voltage in terms of its amplitude and frequency is set at the generator 15 and is applied to the object 1 which is connected in an electrically conductive manner to the generator 15. It is preferable to select a voltage which is negative with respect to the gas chamber surrounding the object 1.

Then, the process gas for producing the adhesion-promoter layer 3 is introduced. The adhesion-promoter layer 3 serves to improve the adhesion between the lubricant layer 5 which is subsequently applied and the material of the object 1 or to improve the adhesion between an intermediate layer 4 which is subsequently applied and the material of the object 1, is introduced.

The adhesion-promoter layer 3 is expediently generated by boriding and/or nitriding and/or carbonizing and/or carbonitriding, which processes are suitably assisted by a plasma 16. In the process, excess gas particles are removed by the pump system 7.

As an alternative or in addition to the above process, to produce the adhesion-promoter layer 3, it is also possible for the appropriate substance(s) to be introduced into the regions which are close to that surface 2 of the object 1 which is to be coated by means of ion implantation.

As a replacement measure or a supplementary measure to the adhesion-promoter layer(s) 3 mentioned above, it is possible in particular for TiN and/or TiC and/or Ti (C, N) and/or a boron carbide layer ($B_4C$) to be deposited on that surface 2 of the object 1 which is to be coated, specifically as the adhesion-promoter layer 3 or as a constituent of the adhesion-promoter layer 3.

The assisting plasma 16 is generated from the interaction between the pulsed electric voltage and hydrogen which, for this purpose, is additionally introduced into the reactor interior 13, and/or the process gas. The plasma 16 is preferably produced in such a way that it shrouds that surface 2 of the object 1 which is to be coated and, if appropriate, also penetrates at least partially into recesses, such as drilled holes and the like, in the object 1. The plasma 16 is preferably produced in the region of the surface of the object 1.

The plasma 16 advantageously heats at least that surface 2 of the object 1 which is to be coated to temperatures of less than 750° C., preferably less than 700° C., and particularly preferably less than 600° C., since at these temperatures at most a slight change in the microstructure of the material of the object 1 is to be expected.

The pulse rate of the electric voltage has an effect, inter alia, on the three-dimensional distribution of the plasma 16. Therefore, the pulse rate and, if appropriate, also the selected electric voltage is expediently set as a function of the three-dimensional design of that surface 2 of the object 1 which is to be coated.

The process gases are expediently gases which contain the element or elements which are required to produce the adhesion-promoter layer 3. This may, for example, result from the process gas containing the element(s) in question in pure form and/or the element(s) in question being made available from the process gas, as dissociation products and/or as ions, under process conditions.

In the above cases, process gases which contain boron and/or nitrogen and/or carbon, at least in the form of a compound, and/or release the corresponding element under process conditions are used as the process gas.

In the case of boriding, boranes ($B_nH_m$), preferably diborane ($B_2H_6$), boron chloride ($BCl_3$) or boron fluoride ($BF_3$) or a mixture of at least two of these gases are used as the process gas. In the case of an object 1 which contains Fe, the boriding leads to the formation of in particular $Fe_2B$ and FeB, which is more brittle than $FeB_2$ and is therefore generally undesirable. Particularly good adhesion of the following layer is achieved if the FeB, in relation to all the iron borides, is formed in a proportion of less than 20%, preferably less than 10%, and particularly preferably less than 1%.

To make it easier to achieve this, it is possible in particular for the boron content in the depositing gas phase, after $Fe_2B$ has been formed in the region of that surface 2 of the object 1 which is to be coated, to be increased by at least 20% within 5 seconds and/or for the temperature of the object 1 in the vicinity of the surface to be reduced.

It is useful to arrange an intermediate layer 4 on the adhesion-promoter layer 3. For this purpose, a gas is introduced into the reactor interior 13 and into the plasma 16 as a second precursor material, which gas contains boron at least in the form of a compound and releases the boron under process conditions.

As with the adhesion-promoter layer 3, in particular boranes ($B_nH_m$), preferably diborane ($B_2H_6$), boron chloride ($BCl_3$) or boron fluoride ($BF_3$) or a mixture of at least two of these gases are used for this purpose.

Furthermore, to form the intermediate layer 4, a first precursor material, which contains oxygen at least in the form of a compound and releases the oxygen under process conditions, is introduced into the depositing gas phase.

The intermediate layer 4, which contains boron and oxygen, is deposited on the adhesion-promoter layer 3 from these two precursor materials.

As a result of the temperature and/or the oxygen level being varied, it is possible to control the proportion of oxygen in the intermediate layer 4, so that the proportion of oxygen within the intermediate layer 4 exhibits a gradient.

It is preferable for the proportion of oxygen to increase at increasing distance from the adhesion-promoter layer 3. The intermediate layer 4 is preferably applied containing boron oxide, in particular as $B_6O$ and/or $B_2O_3$, in which case it is preferable for $B_6O$ to be applied first, followed by $B_2O_3$. Before the boron oxides are applied, it is useful for at least substantially pure boron to be applied to the adhesion-promoter layer 3.

In a similar way to the production of the adhesion-promoter layer 3, in the process the object 1 is heated in particular to temperatures of less than 750° C., preferably less than 700° C., and particularly preferably less than 600° C., during the deposition of the boron- and oxygen-containing intermediate layer 4.

Finally, the lubricant layer 5 of boric acid ($H_3BO_3$) is formed in the region of the exposed surface 2 of the intermediate layer 4. This lubricant layer 5 can be produced immediately inside the reactor 6 using the gases hydrogen, oxygen and boron.

Inside the reactor 6, it is equally possible for those regions of the boron- and oxygen-containing intermediate layer 4 which are close to the surface to be converted into boric acid by reaction with hydrogen or for the boron- and oxygen-containing intermediate layer 4 to be at least partially converted into boric acid from the gas phase as soon as this layer is produced. In both cases, it is expedient for the temperature of the object 1 to be reduced at least in the vicinity of the surface.

Alternatively, it is also possible for this lubricant layer 5 to be formed only in the presence of hydrogen and/or steam when the object 1 is in use. In this case, a chemical reaction of those regions of the boron- and oxygen-containing intermediate layer 4 which are close to the surface with the hydrogen in the atmosphere leads to the formation of the lubricant layer 5 containing boric acid. This reaction is promoted in particular by the heat which is generated in use. In this case, at least certain regions of the boron- and oxygen-containing intermediate layer constitute a reservoir for regenerating boric acid which has been worn away or removed in some other way.

In all cases, the lubricant layer 5 advantageously contains at least 80%, preferably at least 90%, and particularly preferably at least 95% boric acid.

Advantageously, a pulsed DC voltage which has a negative electric potential with respect to the gas chamber surrounding the object 1 is applied to the object 1 inside the reactor 6 not only during production of the adhesion-promoter layer 3, but also during the production of the boron- and oxygen-containing intermediate layer 4 and/or the lubricant layer 5.

A coating which is applied in accordance with the present disclosure may advantageously be used to provide in particular abrasively stressed running surfaces of machine components, preferably engine components, and particularly preferably camshafts, rocker arms, bucket tappets, liners, valve plates, valve stems, valve liners and guides, piston pins, piston rings, cylinder liners, connecting rods, stop discs, and also gear wheels, in particular of transmissions, chain links or belt pulleys for continuously variable transmissions, and also material-removing tools having defined cutter geometries, such as milling cutters, turning tools, disposable tool tips, drills, and also tools for reaming and broaching, as well as abrasively stressed shaping tools, in particular forming tools such as deep-drawing presses and the like, with a useful three-layer coating which exhibits adhesion.

In all applications, it is of particular advantage that lubrication with liquid lubricants which is otherwise required can be at least reduced.

The method according to the invention is described below with reference to a gas flow diagram illustrated in FIG. 4.

Figure 4:
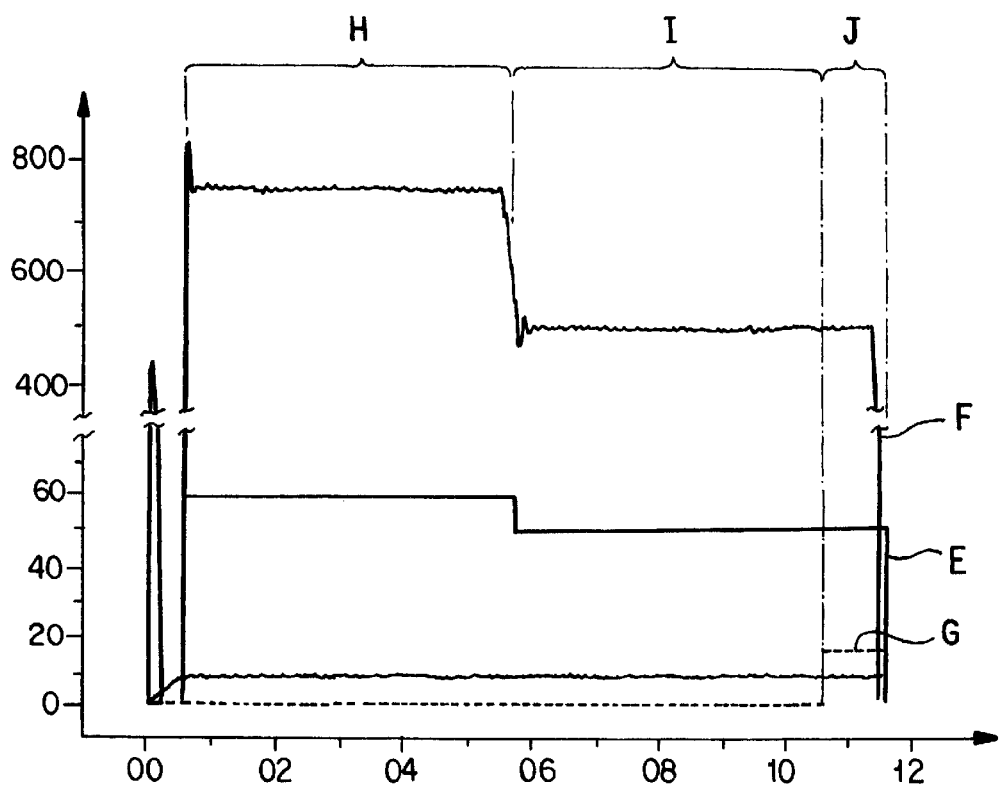
FIG. 4 shows a gas flow diagram during the production of a coating according to the invention.

FIG. 4 shows a gas flow diagram for various gases over the course of time, the temperature of the specimen to be coated also being plotted. The diagram shown in FIG. 4 describes the gas flow which is established in the reactor interior 13 during production of a layer structure according to the invention on a metallic specimen using a plasma CVD process.

In the plasma CVD process, the specimen is heated by a plasma 16 surrounding the specimen. The plasma 16 which heats that surface 2 of the specimen which is to be coated and which also activates the precursor materials and the process gas for deposition or for boriding, is ignited or maintained by a voltage applied to the specimen.

To control the temperature, the temperature of the specimen is measured (curve F) and the electric voltage applied to the specimen for the plasma 16, which has, inter alia, a heating action, is adjusted accordingly. As in the present case, the electric voltage may be a pure DC voltage. Depending on the demands imposed on the plasma 16, a pulsed voltage, an AC voltage or a half-cycle AC voltage is preferably applied instead of the DC voltage.

The level of the pressure p in the reactor interior can be seen from the diagram shown in FIG. 4 as the curve which is second from the bottom and is not individually labelled, the $H_2$ flow, which is mixed with the process gas during the production of the adhesion-promoter and intermediate and lubricant layers (5% $B_2H_6$ and 95% $H_2$), is shown in the diagram in accordance with FIG. 4 as curve E, and the oxygen flow is shown in FIG. 4 as the curve G. The values given for the different gas flows are based on the unit standard cubic centimeters (sccm). Since the process gas with a boriding action is also used for the second precursor material, which supplies boron, the curve F after the boriding (period H) also shows the gas flow of the second precursor material (period I). The lubricant layer is applied during the period J.

If appropriate, the specimen undergoes preliminary cleaning before it is introduced into the reactor 6 and is then introduced into the reactor 6. Next, the reactor interior 13 is evacuated down to a pressure of less than 0.5 mbar. For cleaning purposes, an $H_2$ gas is introduced into the evacuated reactor interior 13 of the reactor 6 for approximately 30 min. The plasma 16 is ignited in the region of the specimen by the $H_2$ gas, and that surface 2 of the specimen which is to be coated is cleaned with the aid of the $H_2$ plasma 16. As can be seen from the diagram shown in FIG. 4, when the specimen is being cleaned, the pressure in the reactor interior 13 rises to approximately 10 mbar. This level is at least substantially maintained during the described production of the layer structure according to the invention of this exemplary embodiment.

After the surface 2 of the specimen has been cleaned, it is exposed to approximately 60 sccm of a $B_2H_6$ gas stream to which 95% $H_2$ has been added, for the period H of approximately 6 hours and at a temperature of approximately 750° C. The adhesion-promoter layer 3 is produced under these process conditions. Under the conditions which have just been described, the specimen is borided over a few μm close to the surface. The borided adhesion-promoter layer 3 improves the adhesion between the intermediate layer 4 which is to be applied subsequently and the lubricant layer 5 which is to be applied after that and the material of the specimen (object 1).

After the boriding, the temperature is reduced to approximately 500° C., and the flow of process gas to which $H_2$ has been added is lowered to approximately 50 sccm. As a result, a boron layer is produced on the adhesion-promoter layer 3 for the period I of approximately 5 hours. This boron layer forms part of the intermediate layer 4.

After the boron layer has grown on, oxygen additionally flows into the reactor 6 for approximately 1 hour (period J), at approximately. 15 sccm, with the previous process parameters (gas flows, temperature and pressure) being maintained. In the process, the boron- and oxygen-containing regions of the intermediate layer are formed first of all.

Then, the temperature is reduced and the remaining parameters are kept constant. As a result of the temperature being reduced, the plasma breaks up and the hydrogen which was previously used as fuel for the plasma is freely available. Consequently, at temperatures of below approximately 200° C. and in the presence of hydrogen, the lubricant layer 5, which substantially contains only the dry lubricant boric acid ($H_3BO_3$), is formed.

What is claimed is:

1. A method for an external and adhesive application of a lubricant layer to an exposed, frictionally stressed surface of an object, said method comprising:

applying an adhesion-promoter layer to the exposed surface of the object;

introducing the object with the applied adhesion-promoter layer into a reactor;

at least one of evacuating the reactor to a pressure of less than 100 mbar or partly filling the reactor with an inert gas;

adding a first precursor material containing boron to a depositing gas phase;

adding a second precursor material containing oxygen to a depositing gas phase;

producing an intermediate layer comprising said first and second precursor materials on the adhesion-promoter layer; and forming a lubricant layer to function as a dry lubricant by at least partially converting boron and oxygen in the intermediate layer at least in a region of its freely accessible surface to form boric acid in the presence of hydrogen.

2. The method of claim 1, wherein the reactor is evacuated to a pressure of less than 10 mbar.

3. The method of claim 1, wherein the reactor is evacuated to a pressure of approximately 1 mbar.

4. The method of claim 1, wherein the boron is in a form of a compound and the boron is released under process conditions to the depositing gas phase.

5. The method of claim 1, wherein the oxygen is in a form of a compound and the oxygen is released under process conditions to the depositing gas phase.

6. A method for an external and adhesive application of a lubricant layer to an exposed, frictionally stressed surface of an object, said method comprising:

introducing the object into a reactor;

applying an adhesion-promoter layer to the exposed surface of the object;

at least one of evacuating the reactor to a pressure of less than 100 mbar or partly filling the reactor with an inert gas;

adding a first precursor material containing boron to a depositing gas phase;

adding a second precursor material containing oxygen to a depositing gas phase;

producing an intermediate layer comprising said first and second precursor materials on the adhesion-promoter layer; and forming a lubricant layer to function as a dry lubricant by at least partially converting boron and oxygen in the intermediate layer at least in a region of its freely accessible surface to form boric acid in the presence of hydrogen.

7. The method of claim 6, wherein the adhesion-promoter layer is applied by at least one of evacuating the reactor or partially filling the reactor with an inert gas; introducing a process gas containing at least one of a boron, nitrogen or carbon element; and adding at least one element of the process gas to a material of the exposed surface (2) of the object (1).

8. The method of claim 7, wherein the at least one of a boron, nitrogen or carbon element is in a form of a compound and said element is released under process conditions into the reactor.

9. The method of claim 8, wherein the element is released by diffusion.

10. The method of claim 7, wherein the element is incorporated into the material of the exposed surface.

11. The method of claim 7, wherein the element chemically reacts with the material of the exposed surface.

12. The method of claim 10, wherein the element is incorporated by at least one of diffusion or ion-implantation.

13. The method of claim 1, wherein the adhesion-promoter layer includes at least one of boron, carbon, nitrogen, boron carbide ($B_4C$), TiN, TiC or Ti (C, N).

14. The method of claim 1, wherein the material of the exposed surface is at least one of borided, nitrided, carbonized or carbonitrided to generate the adhesion-promoter layer.

15. The method of claim 1, wherein the hydrogen is in a form of a compound and the hydrogen is released under process conditions to the reactor.

16. The method of claim 1, wherein borides are formed in a region of the adhesion-promoter layer close to the exposed surface of the object.

17. The method of claim 6, wherein at least one of the process gases or the precursor materials are passed through a plasma and are at least one of partially dissociated or ionized before they come into contact with the exposed surface of the object.

18. The method of claim 17, wherein the plasma is generated in a region of the exposed surface of the object which is to be layered, and at least that surface of the object which is to be layered is heated by the plasma.

19. The method of claim 17, wherein the exposed surface of the object which is to be layered is heated by the plasma.

20. The method of claim 1, wherein during at least one of the application of the adhesion-promoter layer or during the production of the intermediate layer, the object is heated to a temperature of less than 750° C.

21. The method of claim 1, wherein during at least one of the application of the adhesion-promoter layer or during the production of the intermediate layer, the object is heated to a temperature of less than 700° C.

22. The method of claim 1, wherein during at least one of the application of the adhesion-promoter layer or during the production of the intermediate layer, the object is heated to a temperature of less than 600° C.

23. The method of claim 1, wherein during the at least partial conversion to form boric acid, there is a reduction in temperature.

24. The method of claim 4, wherein the boron compound is selected from the group consisting of borane ($B_nH_m$) boron chloride ($BCl_3$), boron fluoride ($BF_3$) or mixture thereof.

25. The method of claim 24, wherein the borane is diborane ($B_2H_6$).

26. The method of claim 8, wherein the boron compound is selected from the group consisting of borane ($B_nH_m$), boron chloride ($BCl_3$), boron fluoride ($BF_3$) or mixture thereof.

27. The method of claim 26, wherein the borane is diborane ($B_2H_6$).

28. The method of claim 1, wherein as soon as the intermediate layer is produced, it is partially converted into boric acid.

29. The method of claim 1, wherein an electric voltage is applied to the object during at least one of the addition of the adhesion-promoter layer, the production of the intermediate layer or the formation of the lubricant layer.

30. The method of claim 29, wherein the electric voltage is a pulsed DC voltage.

31. The method of claim 17, wherein an electric potential which is negative with respect to the surrounding gas chamber is applied to the object.

32. The method of claim 29, wherein an electric potential which is negative with respect to the surrounding gas chamber is applied to the object.

33. The method of claim 1, wherein the first and second precursor material are boron oxide.

34. The method of claim 33, wherein the boron oxide is at least one of $B_2O_3$ or $B_6O$.

35. The method of claim 1, wherein the lubricant layer includes at least 30% boric acid.

36. The method of claim 1, wherein the lubricant layer includes at least 50% boric acid.

37. The method of claim 1, wherein the lubricant layer includes at least 60% boric acid.

38. The method of claim 1, wherein the lubricant layer includes at least 80% boric acid.

39. The method of claim 1, wherein the lubricant layer includes at least 90% boric acid.

40. The method of claim 1, wherein the lubricant layer includes at least 95% boric acid.

41. The method of claim 34, wherein $B_6O$ is applied prior to $B_2O_3$.

42. The method of claim 41, wherein a boron is applied before the $B_6O$.

43. The method of claim 14, wherein the object is metallic.

44. The method of claim 43, wherein the metallic object is an iron-containing object.

45. The method of claim 14, wherein a metal boride is formed as the boride of the adhesion-promoter layer.

46. The method of claim 44, wherein a metal boride is formed as the boride of the adhesion-promoter layer.

47. The method of claim 46, wherein the metal boride is at least one of $Fe_2B$ or FeB.

48. The method of claim 1, wherein the object includes a metal alloy.

49. The method of claim 48, wherein the metal alloy is a lightweight metal alloy.

50. The method of claim 49, wherein the lightweight metal alloy is at least one of a titanium alloy, an aluminum alloy or a magnesium alloy.

51. The method of claim 1, wherein the adhesion-promoter layer includes boron and carbon.

52. The method of claim 1, wherein the adhesion-promoter layer includes boron carbide ($B_4C$).

53. The method of claim 1, wherein the intermediate layer is produced with an oxygen gradient which increases at an increasing distance from the adhesion-promoter layer.

54. The method of claim 47, wherein the FeB, in relation to all the iron borides, is formed in a proportion of less than 20%.

55. The method of claim 47, wherein the FeB, in relation to all the iron borides, is formed in a proportion of less than 10%.

56. The method of claim 47, wherein the FeB, in relation to all the iron borides, is formed in a proportion of less than 1%.

57. The method of claim 47, wherein after $Fe_2B$ has been applied, the proportion of boron be added is increased by at least 20% within 5 seconds.

58. The method of claim 47, wherein after $Fe_2B$ has been applied, at least a temperature is reduced in a vicinity of the exposed surface of the object.

59. A component comprising:

an object with an exposed surface;

an adhesion-promoter layer including at least one of boron, carbon or nitrogen; and a lubricant layer including boric acid ($H_3BO_3$) applied to the adhesion-promoter layer.

60. The component of claim 59, wherein the lubricant layer, at least in a vicinity of the exposed surface, contains at least 5% boric acid.

61. The component of claim 59, wherein the lubricant layer, at least in a vicinity of the exposed surface, contains at least 10% boric acid.

62. The component of claim 59, wherein the lubricant layer, at least in a vicinity of the exposed surface, contains at least 30% boric acid.

63. The component of claim 59, wherein a material of the exposed surface is at least one of borided, carbonized, nitrided or carbonitrided to generate the adhesion-promoter layer.

64. The component of claim 59, further comprising an intermediate layer arranged between the lubricant layer and the adhesion-promoter layer.

65. The component of claim 64, wherein the intermediate layer includes boron and oxygen.

66. The component of claim 65, wherein the intermediate layer has an oxygen gradient which increases at an increasing distance from the adhesion-promoter layer.

67. The component of claim 64, wherein the intermediate layer includes boron, $B_6O$ and $B_2O_3$.

68. The component of claim 64, wherein the intermediate layer, starting from the adhesion-promoter layer, includes a layer of boron, then a layer of $B_6O$, followed by a layer of $B_2O_3$, the $B_2O_3$ layer being in direct contact with the lubricant layer.

* * * * *